(12) United States Patent
Graham et al.

(10) Patent No.: US 10,173,887 B2
(45) Date of Patent: Jan. 8, 2019

(54) EPI-POLY ETCH STOP FOR OUT OF PLANE SPACER DEFINED ELECTRODE

(71) Applicant: Robert Bosch GmbH, Stuttgart (DE)

(72) Inventors: Andrew Graham, Redwood City, CA (US); Gary Yama, Mountain View, CA (US); Gary O'Brien, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/291,374

(22) Filed: Oct. 12, 2016

(65) Prior Publication Data

US 2017/0297896 A1    Oct. 19, 2017

Related U.S. Application Data

(62) Division of application No. 14/201,453, filed on Mar. 7, 2014, now Pat. No. 9,469,522.

(60) Provisional application No. 61/787,376, filed on Mar. 15, 2013.

(51) Int. Cl.
*B81B 3/00* (2006.01)
*B81C 1/00* (2006.01)

(52) U.S. Cl.
CPC ........ *B81B 3/0021* (2013.01); *B81C 1/00095* (2013.01); *B81C 1/00166* (2013.01); *B81B 2201/0271* (2013.01); *B81B 2203/04* (2013.01); *B81B 2203/053* (2013.01); *B81C 2201/014* (2013.01); *B81C 2201/0132* (2013.01); *B81C 2201/0177* (2013.01); *B81C 2203/0136* (2013.01)

(58) Field of Classification Search
CPC ...... B81B 2201/0271; B81B 2203/053; B81B 3/0021
See application file for complete search history.

(56) References Cited

U.S. PATENT DOCUMENTS

| | | |
|---|---|---|
| 6,158,280 A | 12/2000 | Nonomura et al. |
| 6,664,126 B1 | 12/2003 | Devoe et al. |
| 6,913,941 B2 | 7/2005 | O'Brien et al. |
| 7,056,757 B2 | 6/2006 | Ayazi et al. |
| 7,825,484 B2 | 11/2010 | Martin et al. |

(Continued)

FOREIGN PATENT DOCUMENTS

| | | |
|---|---|---|
| TW | 201034933 A | 10/2010 |
| TW | 201125048 A | 7/2011 |

(Continued)

OTHER PUBLICATIONS

Supplementary European Search Report corresponding to European Patent Application 14770043 (7 pages).

(Continued)

*Primary Examiner* — Raj R Gupta
(74) *Attorney, Agent, or Firm* — Maginot Moore & Beck LLP

(57) ABSTRACT

A device with an out-of-plane electrode includes a device layer positioned above a handle layer, a first electrode defined within the device layer, a cap layer having a first cap layer portion spaced apart from an upper surface of the device layer by a gap, and having an etch stop perimeter defining portion defining a lateral edge of the gap, and an out-of-plane electrode defined within the first cap layer portion by a spacer.

3 Claims, 12 Drawing Sheets

(56) References Cited

U.S. PATENT DOCUMENTS

| | | | |
|---|---|---|---|
| 2001/0038148 A1 | 11/2001 | Matromatteo et al. | |
| 2003/0214373 A1 | 11/2003 | Andricacos et al. | |
| 2006/0148133 A1 | 7/2006 | Nunan et al. | |
| 2010/0032775 A1 | 2/2010 | Morris, III et al. | |
| 2010/0155861 A1* | 6/2010 | Zhang | B81C 1/00698 257/415 |
| 2010/0240163 A1 | 9/2010 | Candler et al. | |
| 2010/0295138 A1 | 11/2010 | Montanya Silvestre et al. | |
| 2011/0121412 A1 | 5/2011 | Quevy et al. | |
| 2011/0127622 A1 | 6/2011 | Rudhard et al. | |
| 2011/0221013 A1 | 9/2011 | Patridge et al. | |
| 2012/0261822 A1* | 10/2012 | Graham | B81C 1/00301 257/741 |

FOREIGN PATENT DOCUMENTS

| | | |
|---|---|---|
| TW | 201246449 A | 11/2012 |
| WO | 2012142368 A1 | 10/2012 |

OTHER PUBLICATIONS

Candler et al., "Long-Term and Accelerated Life Testing of a Novel Single-Wafer Vacuum Encapsulation for MEMS Resonators," Journal of Microelectromechanical Systems, Dec. 2006, pp. 1446-1456, vol. 15, No. 6, IEEE, USA (11 pages).

Chen et al., "An Integrated Solution for Wafer-Level Packaging and Electrostatic Actuation of Out-of-Plane Devices," Micro Electro Mechanical Systems,MEMS 2009, IEEE 22nd International Conference, pp. 1071-1074, USA (4 pages).

Chen, "Abstract—Electrode Integrated Wafer-Level Packaging for Out-of-Plane MEMS Devices," International Microelectronics and Packaging Society, http://www.imaps.org/abstracts/system/new/abstract_preview.asp...published at least as early as Apr. 1, 2011 (1 pages).

Hyldgård et al., "Fish & Chips: Single Chip Silicon MEMS CTDL Salinity, Temperature, Pressure and Light Sensor for Use in Fisheries Research," Paper—Micro Electro Mechanical Systems, 2005. MEMS 2005. 18th IEEE International Conference (4 pages).

Park et al., "Ultraminiature encapsulated accelerometers as a fully implantable sensor for implantable hearing aids," Biomed Microdevices, 2007, Springer Science, Korea (11 pages).

Website page, "Encapsulation for RF MEMS," Micromachine Stanford University, http://www.micromachine.stanford.edu/~kuanlinc/Professional/Encapsulation...published at least as early as Apr. 1, 2011 (4 pages).

International Search Report and Written Opinion corresponding to PCT Application No. PCT/US2014/022186, dated Jun. 27, 2014 (13 pages).

English Translation of Taiwan Official Letter corresponding to Taiwan Patent Application No. 103108629 (4 pages).

\* cited by examiner

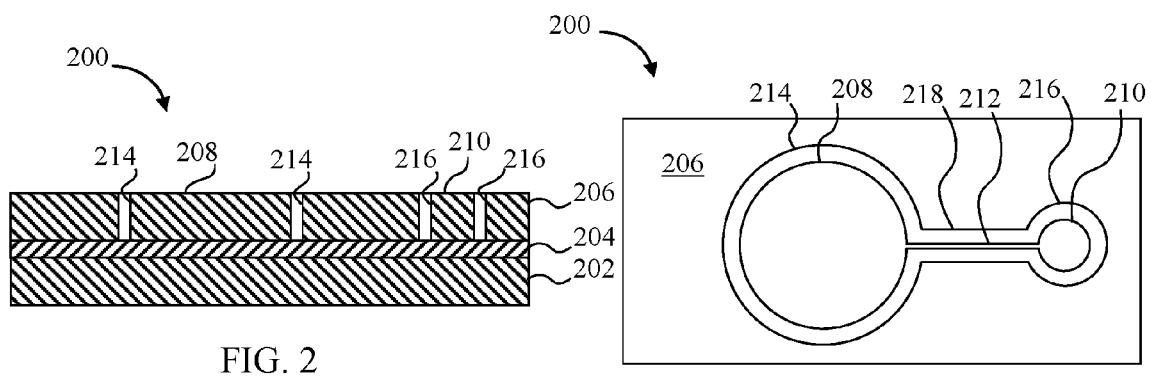
FIG. 2
FIG. 3
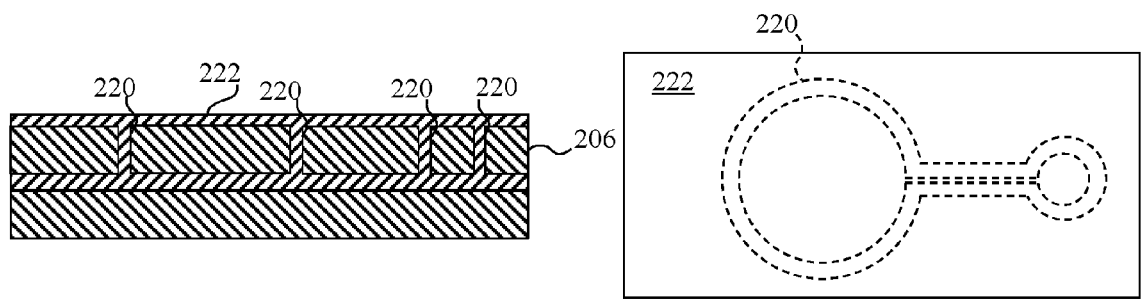
FIG. 4
FIG. 5
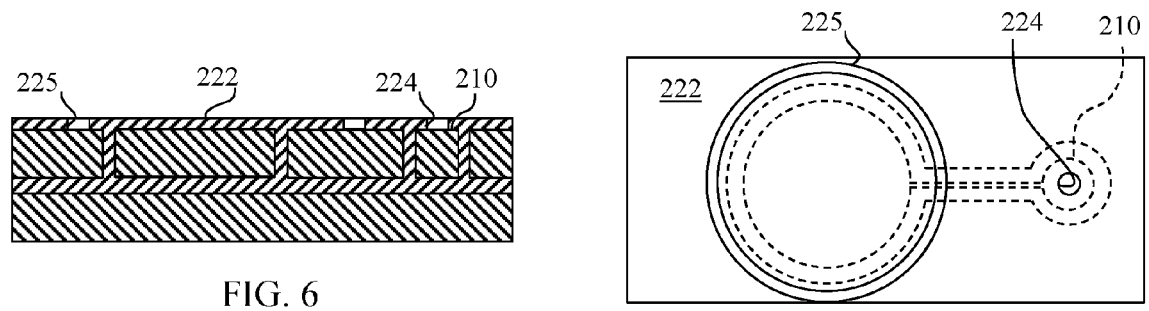
FIG. 6
FIG. 7

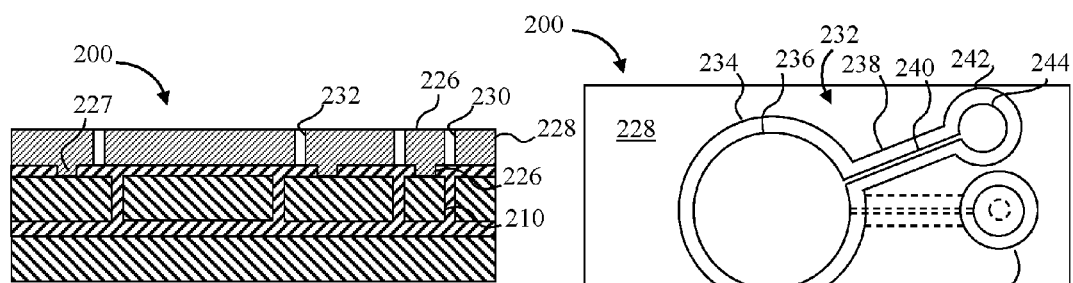
FIG. 8
FIG. 9
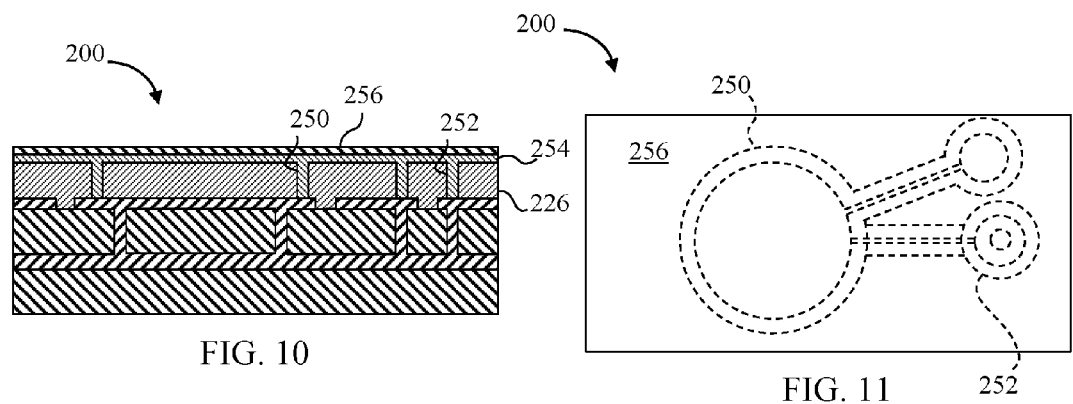
FIG. 10
FIG. 11
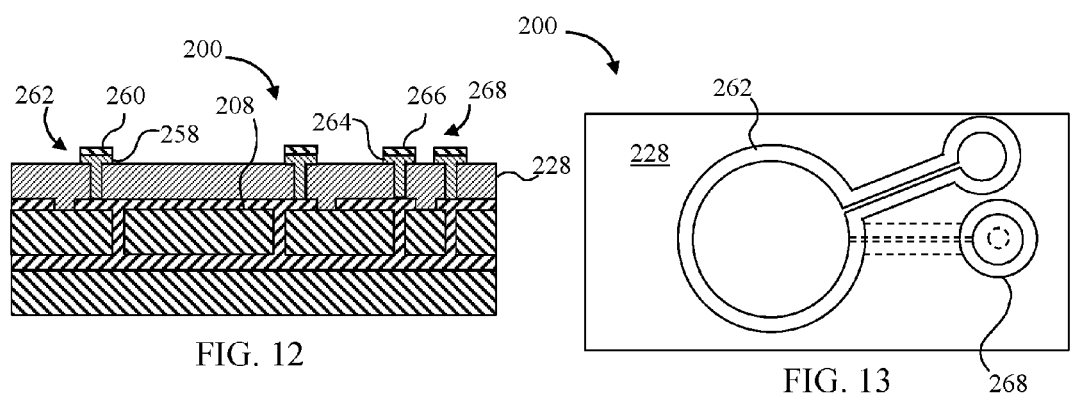
FIG. 12
FIG. 13

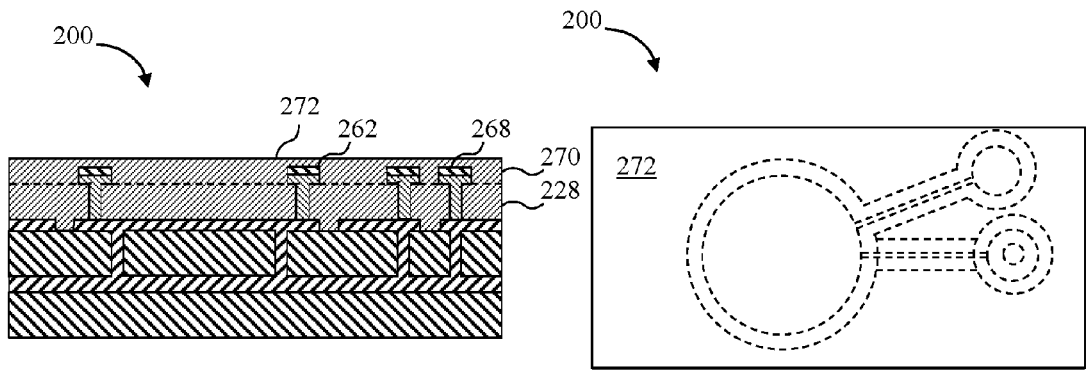
FIG. 14
FIG. 15
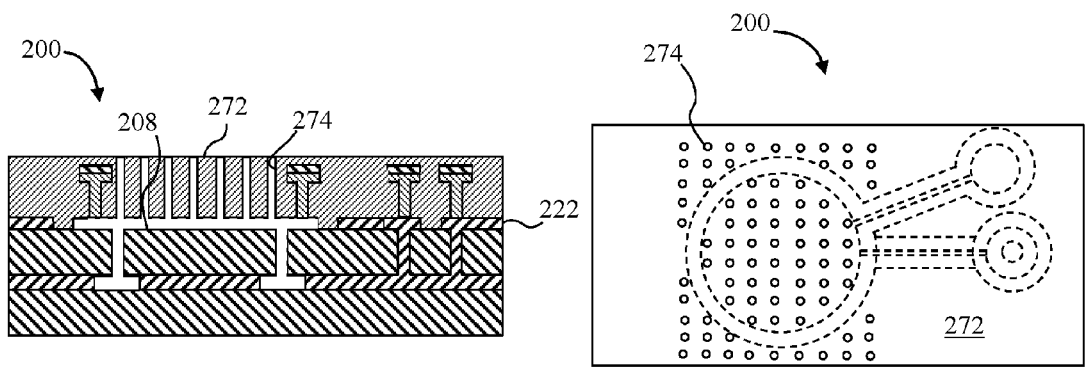
FIG. 16
FIG. 17
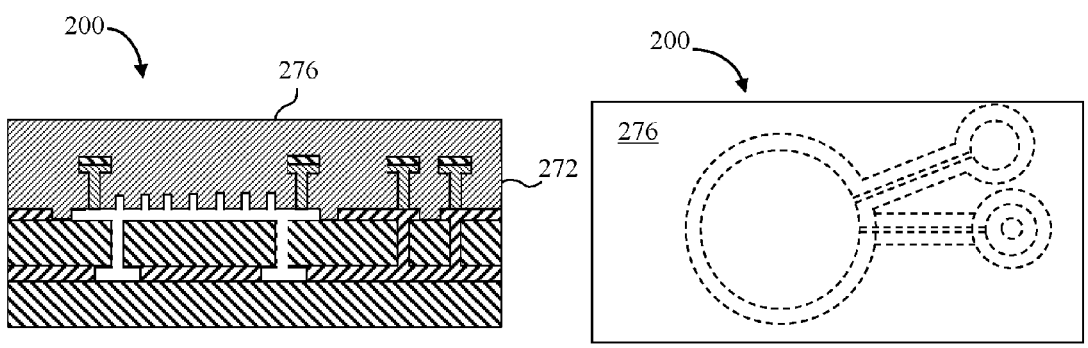
FIG. 18
FIG. 19

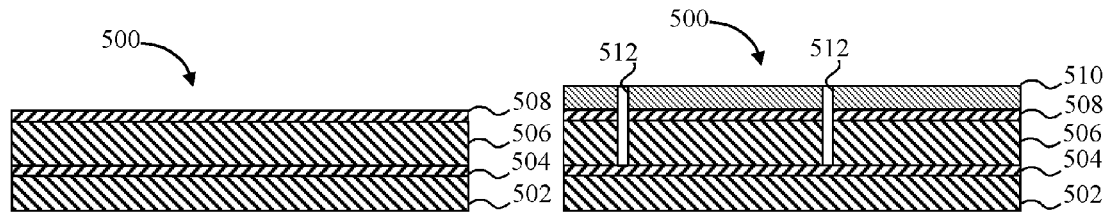
FIG. 41                     FIG. 42
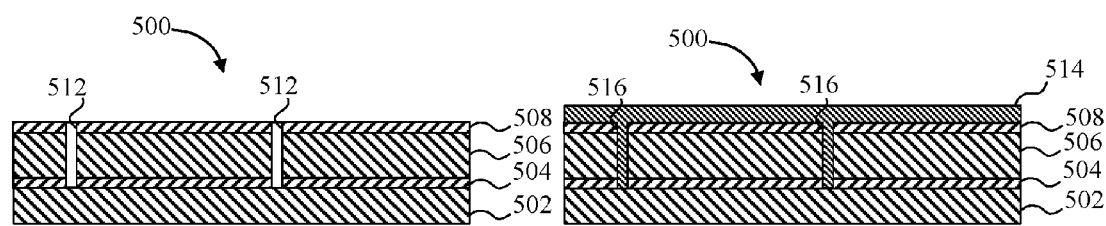
FIG. 43                     FIG. 44
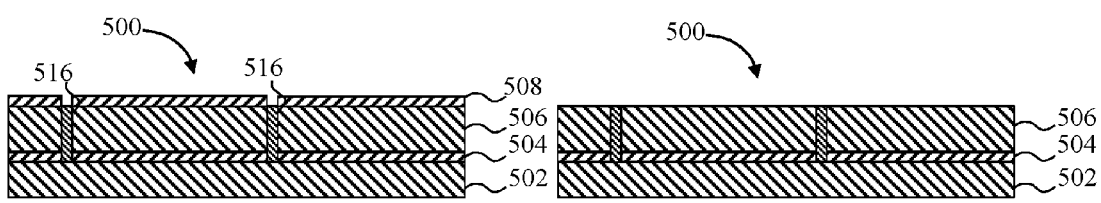
FIG. 45                     FIG. 46
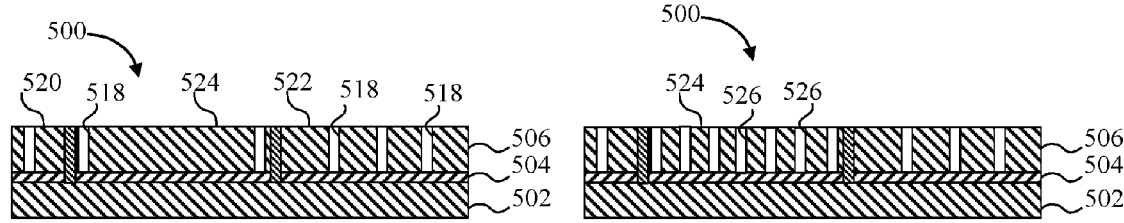
FIG. 47                     FIG. 48

EPI-POLY ETCH STOP FOR OUT OF PLANE SPACER DEFINED ELECTRODE

This application is a divisional of application Ser. No. 14/201,453, filed on Mar. 7, 2014 (now U.S. Pat. No. 9,469,522), which claims the benefit of priority of U.S. Provisional Application No. 61/787,376 filed on Mar. 15, 2013, the disclosures of the above-identified patent and patent application are hereby totally incorporated by reference in their entirety.

TECHNICAL FIELD

This disclosure relates to wafers and substrates such as are used in micromechanical electrical system (MEMS) devices or semiconductor devices.

BACKGROUND

Electrostatic MEMS resonators have been a promising technological candidate to replace conventional quartz crystal resonators due to the potential for smaller size, lower power consumption and low-cost silicon manufacturing. Such devices typically suffer, however, from unacceptably large motional-impedance ($R_x$). MEMS devices operating in the out-of-plane direction, i.e., a direction perpendicular to the plane defined by the substrate on which the device is formed, have the advantage of large transduction areas on the top and bottom surfaces, resulting in a reduction in motional-impedances. Consequently, out-of plane devices have received an increasing amount of attention resulting in significant advances in areas such as digital micro-mirror devices and interference modulators.

The potential benefit of out-of-plane electrodes is apparent upon consideration of the factors which influence the $R_x$. The equation which describes $R_x$ is as follows:

$$R_x = \frac{c_r}{\eta^2}; \text{ with } \eta = V\frac{\partial C}{\partial g} = \frac{\varepsilon_0 A V}{g^2}$$

wherein "$c_r$" is the effective damping constant of the resonator,

"$\eta$" is the transduction efficiency,
"$g$" is the gap between electrodes,
"$A$" is the transduction area, and
"$V$" is the bias voltage.

For in-plane devices, "$A$" is defined as H×L, with "H" being the height of the in-plane component and "L" being the length of the in-plane component. Thus, $\eta$ is a function of H/g and H/g is constrained by the etching aspect ratio which is typically limited to about 20:1. For out-of-plane devices, however, "$A$" is defined as L×W, with "W" being the width of the device. Accordingly, $\eta$ is not a function of the height of the out-of-plane device. Rather, $\eta$ is a function of (L×W)/g. Accordingly, the desired footprint of the device is the major factor in transduction efficiency. Out-of-plane devices thus have the capability of achieving significantly greater transduction efficiency compared to in-plane devices.

Traditionally, out-of-plane electrodes are not fully utilized because of the difficulty in reliably fabricating such devices. For example, packaging is difficult for out-of-plane devices because out-of-plane electrodes are easily damaged during packaging processes. MEMS resonators incorporating an out-of-plane electrode are particularly challenging because such devices require a vacuum encapsulation process.

What is needed therefore is a simple and reliable device with an out-of-plane electrode and method for producing the device. A device incorporating an out-of-plane electrode that is easily fabricated with an encapsulated vacuum would be further beneficial.

SUMMARY

In one embodiment, a method of forming an out-of-plane electrode includes forming an oxide layer above an upper surface of a device layer, etching an etch stop perimeter defining trench extending through the oxide layer, forming a first cap layer portion on an upper surface of the oxide layer and within the etch stop perimeter defining trench, etching a first electrode perimeter defining trench extending through the first cap layer portion and stopping at the oxide layer, depositing a first material portion within the first electrode perimeter defining trench, depositing a second cap layer portion above the deposited first material portion, and vapor releasing a portion of the oxide layer with the etch stop portion providing a lateral etch stop.

In a further embodiment, a device with an out-of-plane electrode includes a device layer positioned above a handle layer, a first electrode defined within the device layer, a cap layer having a first cap layer portion spaced apart from an upper surface of the device layer by a gap, and having an etch stop perimeter defining portion defining a lateral edge of the gap, and an out-of-plane electrode defined within the first cap layer portion by a spacer.

In yet another embodiment a method of forming an out-of-plane electrode includes providing an oxide layer above an upper surface of a device layer, etching an etch stop defining trench extending through the oxide layer, epitaxially depositing a first cap layer portion above an upper surface of the oxide layer and an etch stop cap layer portion within the etch stop defining trench, etching a first electrode perimeter defining trench extending through the first cap layer portion and stopping at the oxide layer, depositing a first insulating material portion within the first electrode perimeter defining trench, and performing an HF vapor etch release on a portion of the oxide layer with the etch stop cap layer portion providing a lateral etch stop.

BRIEF DESCRIPTION OF THE DRAWINGS

FIG. 2 depicts a side cross-sectional view of a wafer with a device layer etched to define an in-plane-electrode;

FIG. 3 depicts a top plan view of the wafer of FIG. 2;

FIG. 4 depicts the wafer of FIG. 2 with the trenches filled with an oxide material and an oxide layer formed above the device layer;

FIG. 5 depicts a top plan view of the wafer of FIG. 4;

FIG. 6 depicts the wafer of FIG. 4 with an opening etched in the oxide layer above a contact portion of the device layer and an additional opening created for an etch stop ring;

FIG. 7 depicts a top plan view of the wafer of FIG. 6;

FIG. 8 depicts the wafer of FIG. 6 with a first cap layer portion formed above the oxide layer and trenches formed in the oxide layer;

FIG. 9 depicts a top plan view of the wafer of FIG. 8;

FIG. 10 depicts the wafer of FIG. 8 with the trenches filled with an insulating material, the insulating material also forming a layer above the first cap layer portion, and an etch stop layer formed above the insulating layer;

FIG. 11 depicts a top plan view of the wafer of FIG. 10;

FIG. 12 depicts the wafer of FIG. 10 after the insulating layer and etch stop layer have been etched to define gaskets for an out-of-plane electrode and a device layer contact;

FIG. 13 depicts a top plan view of the wafer of FIG. 12;

FIG. 14 depicts the wafer of FIG. 12 after a second cap layer portion has been deposited above the first cap layer portion and the gaskets, and the second cap layer portion has been planarized;

FIG. 15 depicts a top plan view of the wafer of FIG. 14;

FIG. 16 depicts the wafer of FIG. 14 after vapor etch vent holes have been etched through the first cap layer portion and the second cap layer portion, and a portion of the oxide layer, the oxide material in the device layer, and a portion of a buried oxide layer have been etched, thereby electrically isolating an in-plane electrode and releasing the first cap layer portion above the in-plane electrode;

FIG. 17 depicts a top plan view of the wafer of FIG. 16;

FIG. 18 depicts the wafer of FIG. 16 after the vapor etch vent holes have been sealed by a third cap layer portion;

FIG. 19 depicts a top plan view of the wafer of FIG. 18;

FIGS. 41-62 depict side cross-sectional views of a wafer as it is processed to form the device of FIG. 40.

DESCRIPTION

Figure 1:
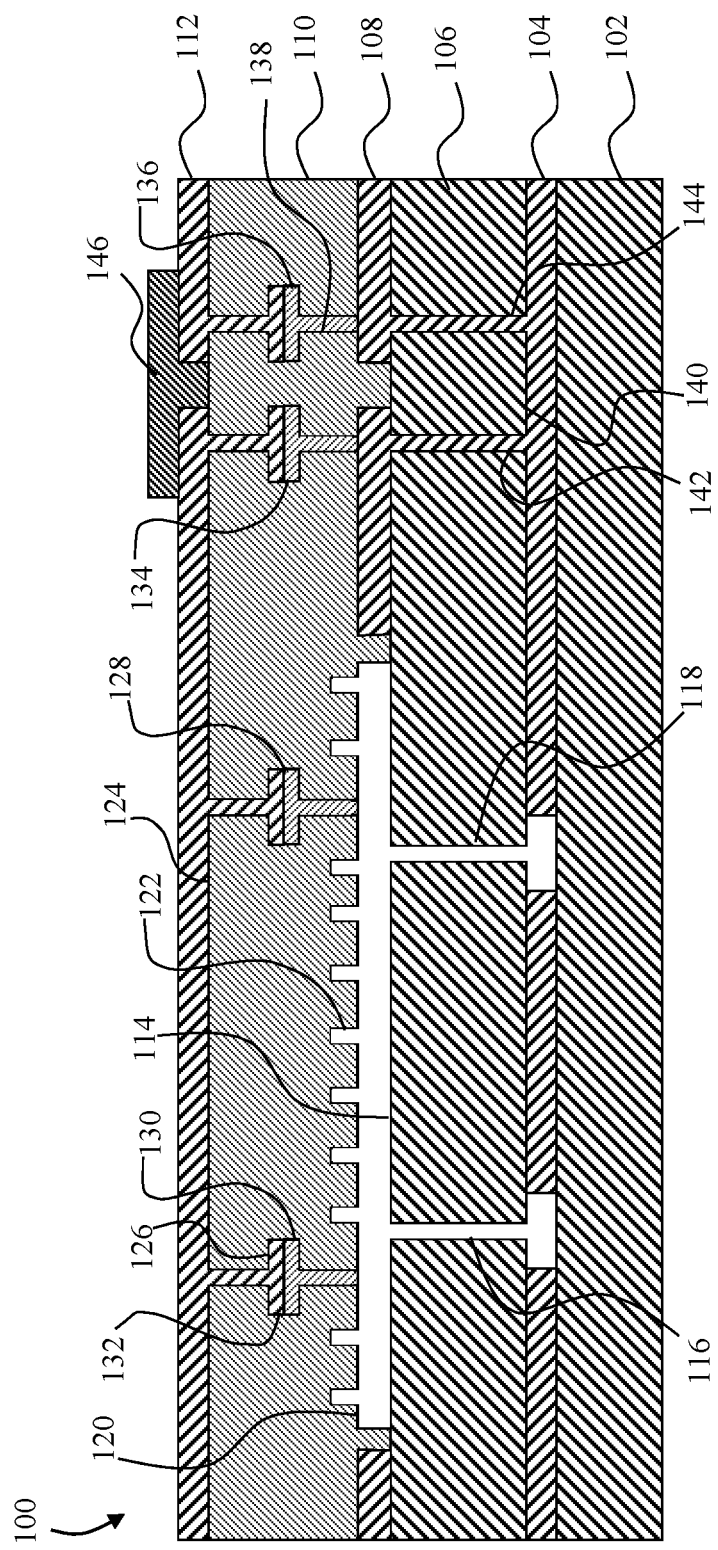
FIG. 1 depicts a side cross-sectional view of a sensor device incorporating a spacer defining an out-of-plane electrode, the spacer including two trench portions and a gasket portion in accordance with principles of the invention.

For the purposes of promoting an understanding of the principles of the invention, reference will now be made to the embodiments illustrated in the drawings and described in the following written specification. It is understood that no limitation to the scope of the invention is thereby intended. It is further understood that the present invention includes any alterations and modifications to the illustrated embodiments and includes further applications of the principles of the invention as would normally occur to one skilled in the art to which this invention pertains.

FIG. 1 depicts a pressure sensor 100 including a handle layer 102, a buried oxide layer 104, and a device layer 106. An oxide layer 108 separates the device layer 106 from a cap layer 110. A passive layer 112 is located above the cap layer 110.

Within the device layer 106, an in-plane electrode 114 is defined by two etch portions 116 and 118. The in-plane electrode 114 is isolated from the cap layer 110 by an etched portion 120 of the oxide layer 108. The etched portions 116, 118, and 120 are etched through vent holes 122 which are closed by the cap layer 110.

An out-of plane electrode 124 is located above the in-plane electrode 114 and electrically isolated from the in-plane electrode 114 by the etched portion 120. The out-of-plane electrode 124 is isolated from the rest of the cap layer 110 by two spacers 126 and 128. The spacers 126 and 128 include a lower nitride portion 130 which extends upwardly from the etched portion 120, and an upper oxide portion 132 which extends from the nitride portion 130 to the upper surface of the cap layer 110.

Spacers 134 and 136, which are formed like the spacers 126 and 128, electrically isolate a connector 138 in the cap layer 110 from the rest of the cap layer 110. The connector 138 is in electrical communication with a connector 140 in the device layer 106. The connector 140 is in electrical communication with the in-plane electrode 114, as described more fully below, and isolated from the remainder of the device layer 106 by isolation posts 142 and 144. The isolation posts 142 and 144 extend from the buried oxide layer 104 to the oxide layer 108. A bond pad or trace 146 is located above the passive layer 112 and in electrical communication with the connector 138.

A process for forming a sensor such as the pressure sensor 100 is discussed with reference to FIGS. 2-23. Referring initially to FIGS. 2 and 3, an SOI wafer 200 including a handle layer 202, a buried oxide layer 204, and a device layer 206 is initially etched to define an in-plane electrode 208 and a lower contact portion 210 for the in-plane-electrode 208. A connector 212 is etched between the in-plane electrode 208 and the lower contact portion 210. The in-plane electrode 208 is defined by a trench portion 214, while the lower contact portion 210 is defined by a trench portion 216 and the connector 212 is defined by a trench portion 218. If desired, the structural or handle layer 202 may be a pressure chemical vapor deposition (LPCVD) or epi-polysilicon layer.

The trench portions 214, 216, and 218 are then filled with a trench oxide portion 220 as shown in FIGS. 4 and 5 using a conformal oxide deposition. Oxide deposition further results in an oxide layer 222 on the upper surface of the device layer 206. The thickness of the oxide layer 222 sets the gap between two electrodes as discussed more fully below. The oxide layer 222 may be planarized by any desired technique such as chemical mechanical polishing (CMP).

Referring to FIGS. 6 and 7, a contact opening 224 is then etched through the oxide layer 222 to expose the upper surface of the lower contact portion 210. An etch stop ring opening 225 is also etched through the oxide layer 222 to expose the upper surface of the device layer 206. An epi-poly deposition fills the contact opening 224 with a lower middle contact portion 226 of epi-poly while depositing a lower cap layer portion 228 above the oxide layer 222 as shown in FIGS. 8 and 9. The epi-poly deposition further fills the etch stop ring opening 225 to form a etch stop ring portion 227 in the oxide layer 222 which is contiguous with the lower cap layer portion 228. The lower middle contact portion 226 thus extends from the upper surface of the lower contact portion 210 to the upper surface of the lower cap layer portion 228. In an alternative embodiment, the lower cap layer portion 228 may be a single crystal silicon formed using a fusion bonding process followed by grinding/polishing or SmartCut technology to remove the bulk of the bonded wafer. In this alternative embodiment, electrical contacts must be formed after fusion. In a further embodiment, a polished polysilicon device layer may be used.

FIGS. 8 and 9 further show trenches 230 and 232 which may be etched after CMP of the lower cap layer portion 228. The trench 230 extends from the upper surface of the lower cap layer portion 228 to the upper surface of the oxide layer 222 to define the lower middle contact portion 226. The trench 232 includes a trench portion 234 that defines a lower out-of-plane electrode portion 236, a trench portion 238 that defines a connector 240, and a trench portion 242 that defines a lower contact portion 244 for the lower out-of-plane electrode portion 236.

A low stress nitride is then used to fill the trenches 230 and 232 with trench nitride portions 250 and 252 while a low stress nitride layer 254 is deposited on the upper surface of the lower cap layer portion 228 as shown in FIGS. 10 and 11. A thin oxide layer 256 is provided on the upper surface of the low stress nitride layer 254. The thin oxide layer 256 and the nitride layer 254 are then patterned and etched resulting in the configuration of FIGS. 12 and 13. In FIGS. 12 and 13, a remainder 258 of the oxide layer 256 and a remainder 260 of the nitride layer 254 form a gasket 262 for an out-of plane electrode described more fully below. A remainder 264 of the oxide layer 256 and a remainder 266 of the nitride layer 254 form a gasket 268 for a contact the in-plane-electrode 208. The lateral extent of the gaskets 262 and 268 when viewed in cross-section may be selected to provide the desired isolation characteristics for the components defined thereby.

A thin epi-poly deposition layer 270 is then formed on the upper surface of the lower cap portion 228 and the upper surface of the gaskets 262 and 268 to form a middle cap layer portion 272 (see FIGS. 14 and 15). The epi-poly deposition layer may be deposited in the manner described by Candler et al., "Long-Term and Accelerated Life Testing of a Novel Single-Wafer Vacuum Encapsulation for MEMS Resonators", *Journal of Microelectricalmechanical Systems*, vol. 15, no. 6, December 2006. The middle cap layer portion 272 may be planarized if desired.

Referring to FIGS. 16 and 17, after vent holes 274 are formed, an HF vapor etch release is performed which releases the middle cap layer portion 272 from the in-plane-electrode 208. The etched portion of the oxide layer 222 between the upper surface of the in-plane-electrode 208 and the lower surface of the middle cap layer portion 272 thus sets the gap between the in-plane-electrode 208 and the lower surface of what will be the out-of-plane electrode. The etch stop ring portion 227 serves as a lateral etch stop, controlling the lateral dimension. A clean high temperature seal is then performed in an epi reactor to seal the vent holes 274. Alternatively, the vent holes 274 may be sealed using oxide, nitride, silicon migration, etc. The resulting configuration is shown in FIGS. 18 and 19 wherein a layer portion 276 is formed above the middle cap layer portion 272.

Figure 20:
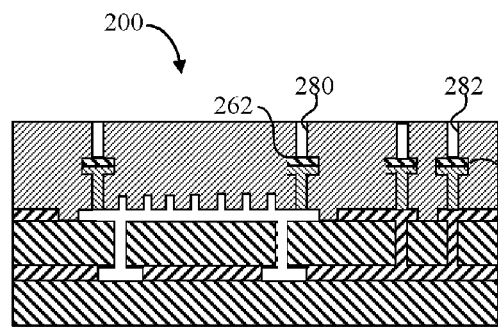
FIG. 20 depicts the wafer of FIG. 18 with trenches formed through the third cap layer portion and the second cap layer portion to upper surfaces of the gaskets.
Figure 21:
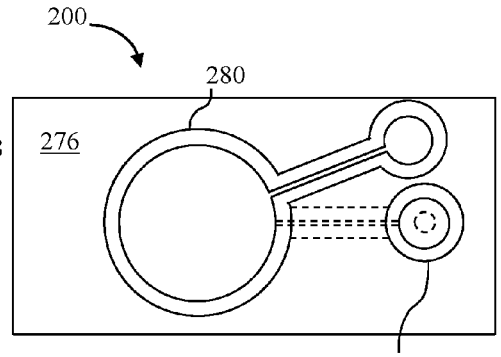
FIG. 21 depicts a top plan view of the wafer of FIG. 20.
Figure 22:
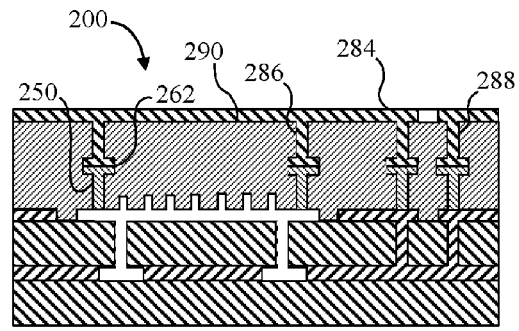
FIG. 22 depicts the wafer of FIG. 20 with an insulating material deposited within the trenches and along the upper surface of the third cap layer portion, and a contact opening etched through the insulating material to expose a contact portion of the cap layer.
Figure 23:
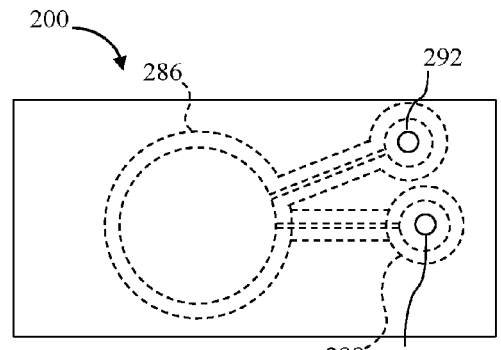
FIG. 23 depicts a top plan view of the wafer of FIG. 22.

A trench 280 and a trench 282 are then etched as depicted in FIGS. 20 and 21. The trench 280 extends from the upper surface of the layer portion 276 to the upper surface of the gasket 262 which acts as an etch stop. The trench 282 extends from the upper surface of the layer portion 276 to the upper surface of the gasket 268 which acts as an etch stop. A passivation layer 284, which may be oxide, nitride, etc., is then deposited on the upper surface of the layer portion 276 as depicted in FIGS. 22-23. The deposited passivation material also fills the trenches 280 and 282 with passivation portions 286 and 288. The passivation portion 286, the gasket 262, and the trench nitride portion 250 thus form a spacer defining an out-of-plane electrode 290.

The passivation layer 284 is then etched to create openings 292 and 294. A metal layer may then be deposited on the passivation layer 284, and etched to create bond pads or traces, resulting in a configuration such as the configuration of the pressure sensor 100 of FIG. 1. If desired, piezoresistors may also be deposited on the passivation layer 284.

Figure 24:
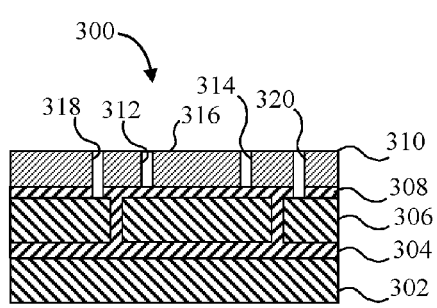
FIG. 24 depicts a side cross-sectional view of a wafer including electrode defining trenches extending through a cap layer portion to an oxide layer and etch stop trenches extending through the cap layer portion and the oxide layer to an upper surface of a device layer.

The above described process may be modified in a number of ways to provide additional features. By way of example, FIG. 24 depicts a wafer 300 at about the same process step as the wafer 200 in FIG. 8. The wafer 300 includes a handle layer 302, a buried oxide layer 304, a device layer 306, an oxide layer 308, and a lower middle cap layer portion 310. FIG. 24 further depicts electrode isolation trenches 312 and 314 which are used to isolate an out-of plane electrode portion 316 from the remainder of the lower middle cap layer portion 310. The wafer 300 further includes release stop trenches 318 and 320. The trenches 318 and 320 are formed by etching through the oxide layer 308 after the trenches 312 and 314 are formed. The trenches 318 and 320 are used to provide a time-independent cap footprint.

Figure 25:
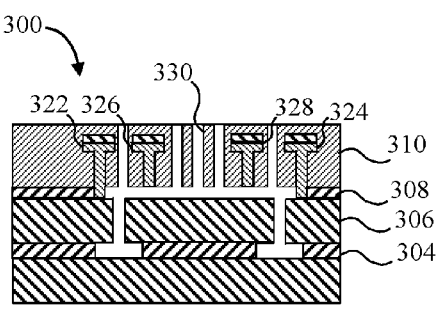
FIG. 25 depicts a side cross-sectional view of the wafer of FIG. 24 with nitride trench portions filling the electrode defining trenches, nitride etch stop portions filling the etch stop trenches, gaskets formed above the nitride trench portions and the nitride etch stop portions, and etch vent holes extending through a cap layer, wherein etching of the oxide layer has been constrained by the nitride etch stop portions.

By way of example, FIG. 25 depicts the wafer 300 after release of the lower middle cap layer portion 310. In FIG. 25, a silicon rich nitride has been deposited and etched to form release stop nitride portions 322 and 324 and electrode isolation nitride portions 326 and 328. Additionally, vent holes 330 have been etched through the lower middle cap layer portion 310 and a portion of the oxide layer 308 has been etched. The foregoing steps are accomplished substantially in the same manner as similar steps described above with respect to FIGS. 10-17.

The primary difference between the wafer 200 and the wafer 300, however, is that the release stop nitride portions 322 and 324 formed in the oxide layer 308 function as an etch stop. Accordingly, once the etch of the oxide layer 308 reaches the release stop nitride portions 322 and 324, no further etching of the oxide layer 308 occurs, even as the buried oxide layer 304 continues to be etched. Thus, while in the wafer 200 the area of the oxide layer 222 which is etched to release the lower cap layer portion 228 from the device layer 206 is a function of the positioning of the vent holes 274 (see FIGS. 16-17) and the etch stop ring 227, the wafer 300 includes release stop nitride portions 322 and 324 which provide a precise footprint for the released portion of the lower middle cap layer portion 310. In some embodiments, nitride refilled etch stops are used along with silicon refilled etch stops (e.g., the etch stop ring 227) as lateral etch stops.

Figures 26, 27:
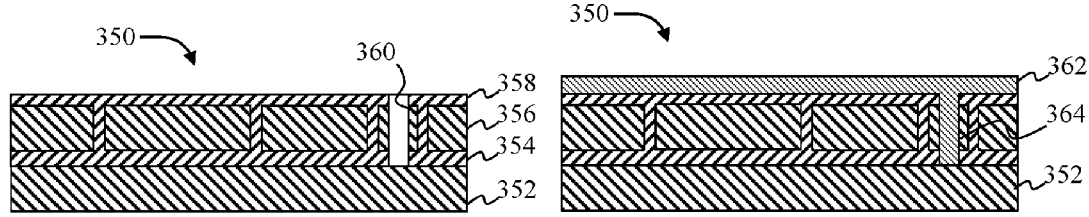
FIGS. 26-38 depict side cross-sectional views of a wafer as it is processed to provide an electrical contact on the upper surface of the device which extends to the handle layer of the device, while being isolated from the device layer and the cap layer, wherein etching of an oxide layer between the device layer and the cap layer has been constrained by nitride etch stop portions.

A further modification of the process described with reference to FIGS. 2-23 is depicted in FIGS. 26-37. FIG. 26 depicts a wafer 350 at about the same process step as the wafer 200 in FIG. 6. The wafer 350 includes a handle layer 352, a buried oxide layer 354, a device layer 356, and an oxide layer 358. The wafer 300 is modified to provide a substrate electrical contact, however, by etching a trench 360 completely through the oxide layer 358, the device layer 356, and the buried oxide layer 354. Then, formation of a lower cap layer portion 362 (see FIG. 27) further forms an epi-poly contact portion 364 which extends to the handle layer 352. CMP may be performed on the lower cap layer portion 362.

Figures 28, 29:
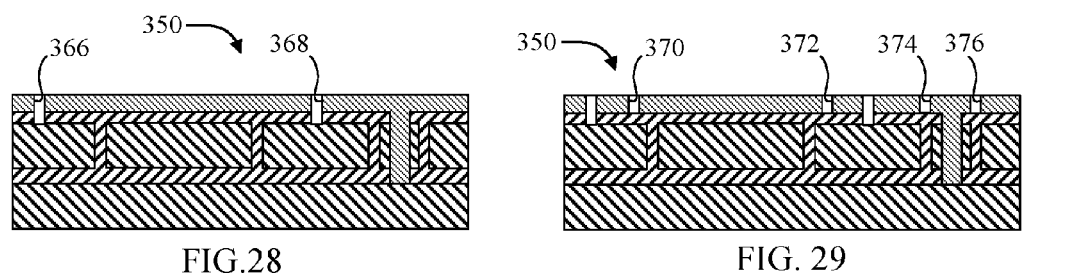

As depicted in FIG. 28, release stop trenches 366 and 368 are then etched through the lower cap layer portion 362 and the oxide layer 358 followed by etching of electrode isolation trenches 370 and 372 and contact isolation trenches 374 and 376 (see FIG. 29). The isolation trenches 370, 372, 374, and 376 extend only through the lower cap layer portion 362.

Figures 30, 31:
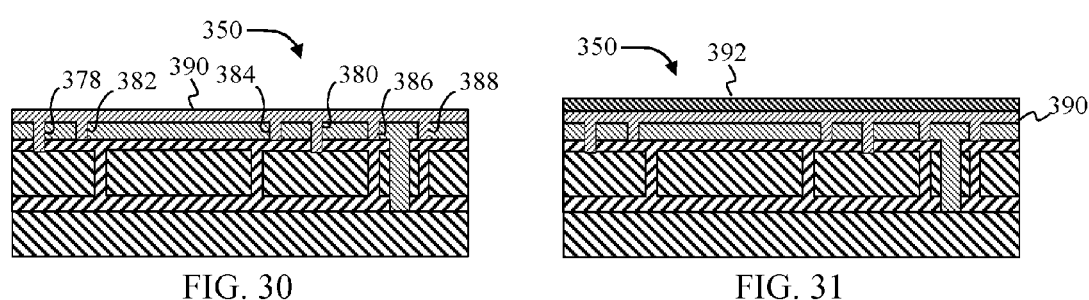
Figures 32, 33:
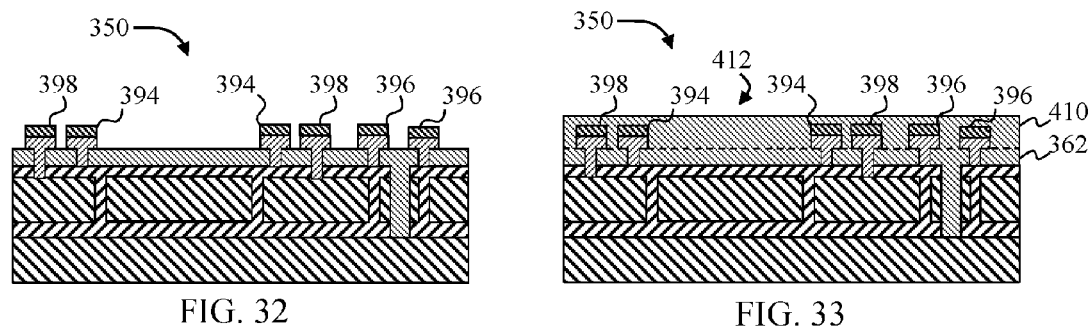

A low stress nitride is then used to fill the trenches 366, 368, 370, 372, 374, and 376 with release stop nitride portions 378 and 380, electrode isolation nitride portions 382 and 384, and contact isolation portions 386 and 388 while a low stress nitride layer 390 is deposited on the upper surface of the lower cap layer portion 362 as shown in FIG. 30. A thin oxide layer 392 is provided on the upper surface of the low stress nitride layer 390 (FIG. 31). The thin oxide layer 392 and the nitride layer 390 are then patterned and etched resulting in the configuration of FIG. 32. FIG. 32 shows an electrode gasket 394, a contact gasket 396, and an etch stop gasket 398.

A thin epi-poly deposition layer 410 is then formed on the upper surface of the lower cap portion 362 and the upper surface of the gaskets 394, 396, and 398 to form a middle cap layer portion 412. The middle cap layer portion 412 may be planarized if desired.

Figure 34:
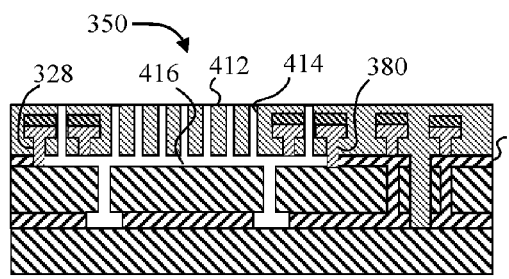
Figure 35:
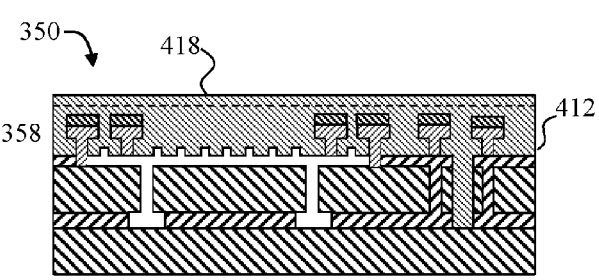

Referring to FIG. 34, after vent holes 414 are formed, an HF vapor etch release is performed which releases the middle cap layer portion 412 from the in-plane-electrode 416. The etched portion of the oxide layer 358 between the upper surface of the in-plane-electrode 416 and the lower surface of the middle cap layer portion 412 is constrained by the release stop nitride portions 378 and 380. A clean high temperature seal is then performed in an epi reactor to seal the vent holes 414. The resulting configuration is shown in FIG. 35 wherein a layer portion 418 is formed above the middle cap layer portion 412.

Figure 36:
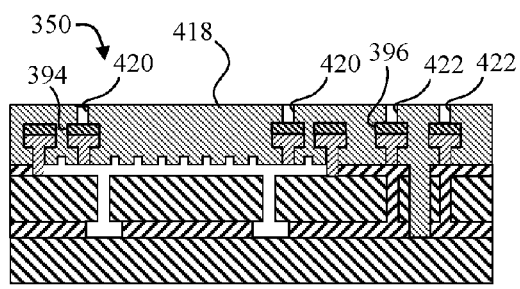
Figure 37:
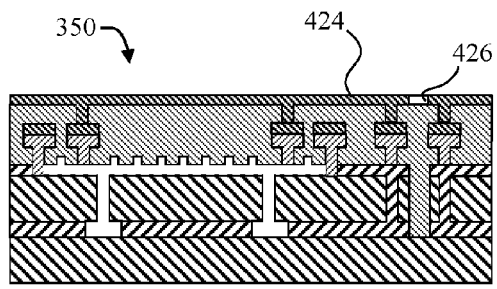
Figure 38:
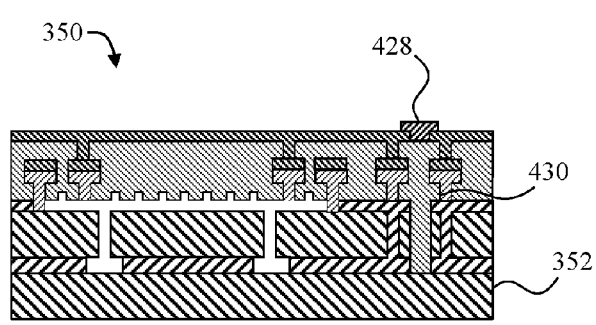

A trench 420 and a trench 422 are then etched as depicted in FIG. 36. The trench 420 extends from the upper surface of the layer portion 418 to the upper surface of the gasket 394 which acts as an etch stop. The trench 422 extends from the upper surface of the layer portion 418 to the upper surface of the gasket 396 which acts as an etch stop. A passivation layer 424, which may be oxide, nitride, etc., is then deposited on the upper surface of the layer portion 418 as depicted in FIG. 37. The passivation layer 418 is etched to create an out-of-plane electrode opening (not shown) and an opening 426. A metal layer may then be deposited on the passivation layer 424, and etched to create a bond pad or trace 428, as shown in FIG. 38. In FIG. 38, the bond pad 428 is in electrical communication with the handle layer 352 through an epi column 430.

Figure 39:
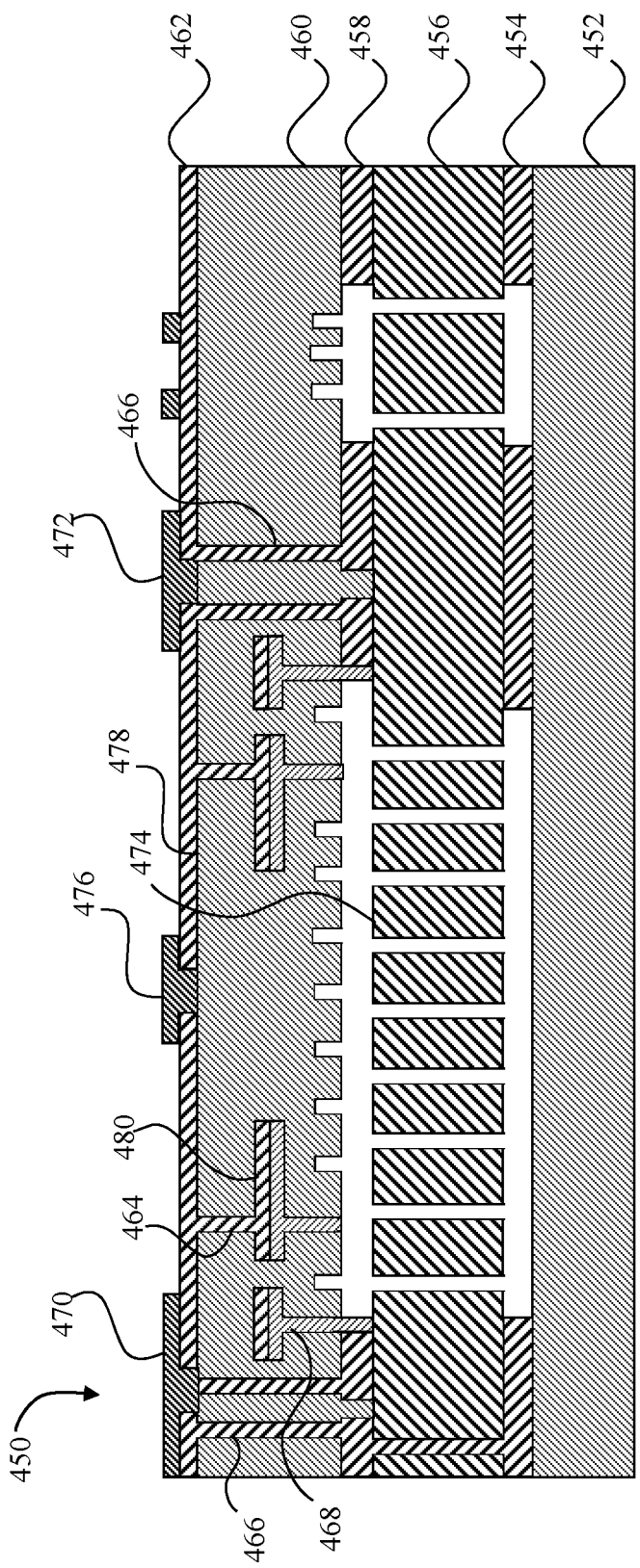
FIG. 39 depicts a side cross-sectional view of a MEMS device with a proof mass which may be fabricated using substantially the same process described with respect to FIGS. 26-38, the device including two electrically isolated contacts in the device layer on opposite sides of the proof mass and optionally including an out-of-plane electrode.

The various processes described above allow for a variety of devices to be made simultaneously on the same substrate. By way of example, FIG. 39 depicts a sensor device 450 that includes a handle layer 452, a buried oxide layer 454, a device layer 456, an oxide layer 458, a cap layer 460, and a passivation layer 462. The sensor device 450 further includes an electrode isolation portion 464, contact isolation portions 466, and release or etch stop nitride portions 468. Thus, the same sequence described above may be used to form the sensor device 450

The sensor device 450, although made using the same process as, for example, the pressure sensor 100 of FIG. 1, is different from the embodiments described above. For example, the device 450 includes two pads 470 and 472 which provide for electrical communication with the device layer 456. Thus, in-plane movement of a proof mass 474 may be detected. An optional third pad 476 may be provided if an out-of-plane electrode 478 is desired. Another difference in the sensor device 450 is that the electrode isolation nitride portions 464 include an extended apron 480.

Figure 40:
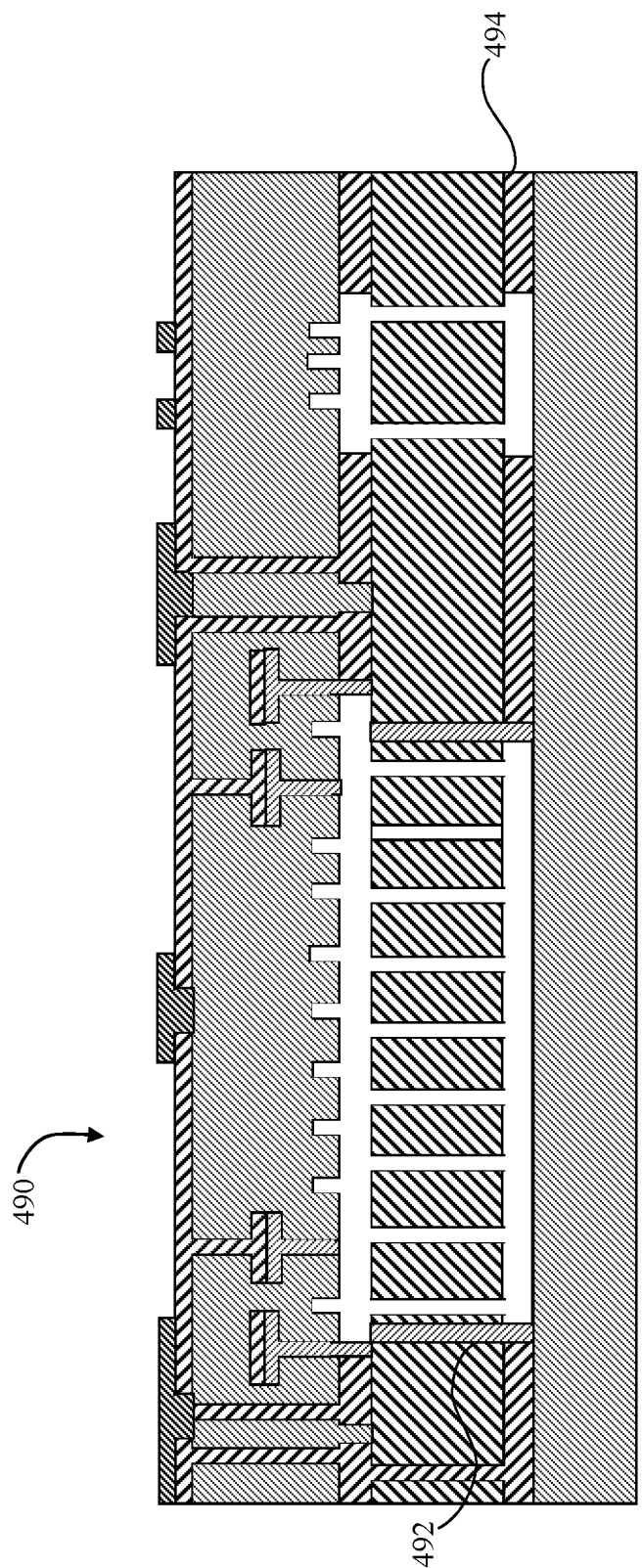
FIG. 40 depicts a side cross-sectional view of a MEMS device with a proof mass which may be fabricated using substantially the same process described with respect to FIGS. 26-38, with an optional out-of-plane electrode and two electrically isolated contacts in the device layer on opposite sides of the proof mass, wherein etching of a buried oxide layer between the device layer and the handle layer has been constrained by nitride etch stop portions.

By adding an interim step to the foregoing process, the accelerometer 490 of FIG. 40 may be simultaneously fabricated along with the above described devices. The accelerometer 490 differs from the sensor device 450 of FIG. 39 in that a release or etch stop nitride portion 492 is included to more precisely control the amount of etching within a buried oxide layer 494.

A process for forming a sensor such as the accelerometer 490 is discussed with reference to FIGS. 41-62. Referring initially to FIG. 41, an SOI wafer 500 including a handle layer 502, a buried oxide layer 504, and a device layer 506 is initially covered with an oxide layer 508. Next, a photoresist layer 510 is provided on the upper surface of the oxide layer 508 (FIG. 42). The wafer 500 is then etched to form etch stop trenches 512 through the photoresist layer 510, the oxide layer 508, and the device layer 506. As shown in FIG. 43, the trenches 512 are then extended through the buried oxide layer 504 to the upper surface of the handle layer 502. A plasma containing oxygen may be used to oxidize ("ash") the photoresist layer 510.

As shown in FIG. 44, a nitride layer 514 is then deposited on the upper surface of the oxide layer 508. Nitride deposition further results in filling the trenches 512 with nitride etch stop columns 516. The nitride layer 514 is then etched using the oxide layer 508 as an etch stop resulting in the configuration of FIG. 45, followed by etching of the oxide layer 508 using the silicon device layer 506 as an etch stop resulting in the configuration of FIG. 46.

Figures 49, 50:
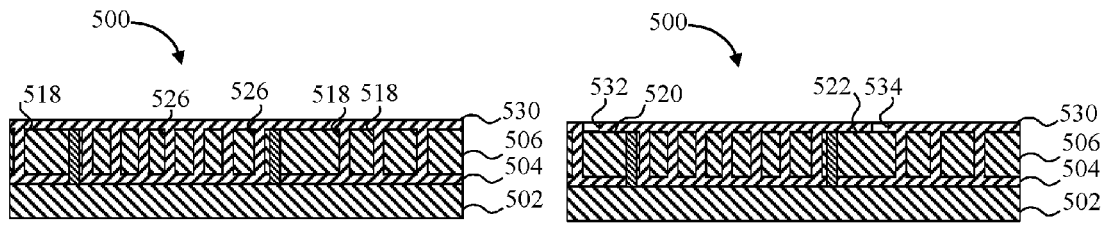

Next, as shown in FIG. 47, structure defining trenches 518 are etched through the device layer 506. The trenches 518 define device layer contact portions 520 and 522 along with a proof mass 524. Sacrificial etch holes 526 are etched into the proof mass 524 as shown in FIG. 48. Referring to FIG. 49, a conformal oxide layer 530 is then deposited on the upper surface of the device layer 506. The deposition of conformal oxide also fills the trenches 518 and the etch holes 526. Openings 532 and 534 (see FIG. 50) are then etched through the oxide layer 530 to expose the device layer contact portions 520 and 522.

Figures 51, 52:
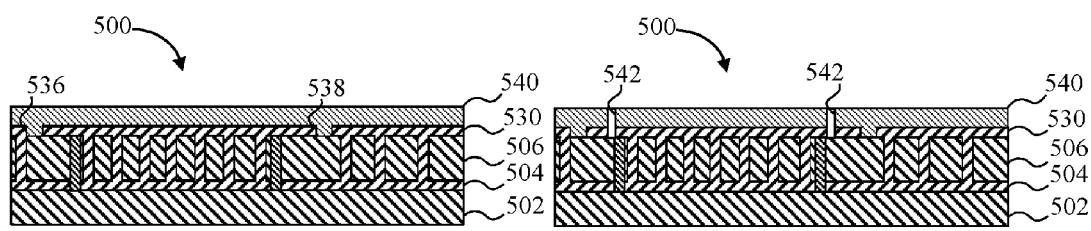

An epi-poly deposition fills the contact openings 532 and 534 with lower middle contact portions 536 and 538 of epi-poly while depositing a lower cap layer portion 540 above the oxide layer 530 as shown in FIG. 51. CMP may be performed on the lower cap layer portion 540. Next, as shown in FIG. 52, etch stop trenches 542 are formed through the lower cap layer portion 540 and the oxide layer 530. If desired, out-of-plane electrode trenches 544 may be formed through the lower cap layer portion 540 (see FIG. 53).

Figures 53, 54:
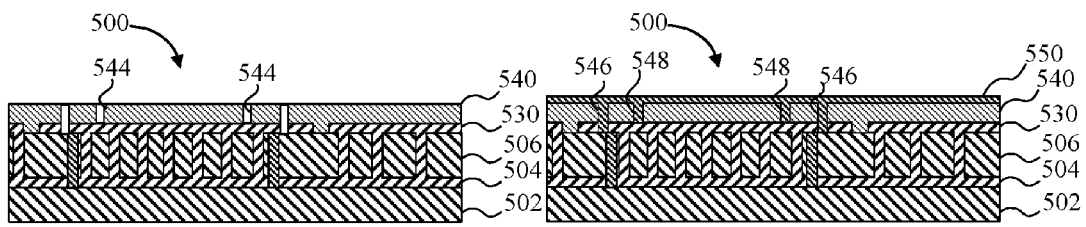
Figures 55, 56:
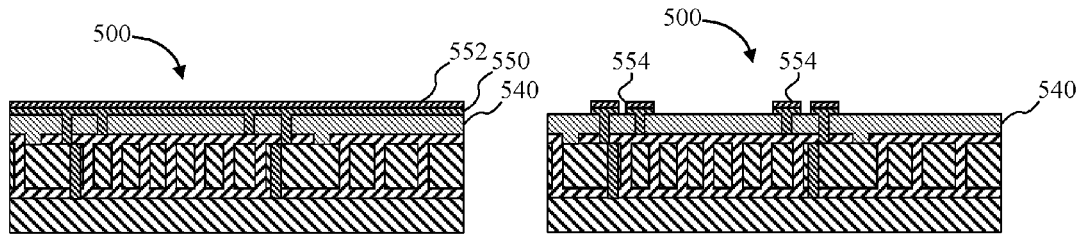

A low stress nitride is then used to fill the trenches 542 and 544 with trench nitride portions 546 and 548 while a low stress nitride layer 550 is deposited on the upper surface of the lower cap layer portion 540 as shown in FIG. 54. The nitride portions 546 form an etch stop for a later etch. A thin oxide layer 552 is provided on the upper surface of the low stress nitride layer 550. The thin oxide layer 552, which will be used as an etch stop, and the nitride layer 550 are then patterned and etched resulting in the gasket 554 of FIG. 56.

Figure 57:
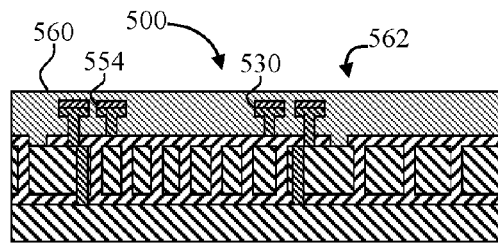

A thin epi-poly deposition layer 560 is then formed on the upper surface of the lower cap portion 540 and the upper surface of the gasket 554 to form a middle cap layer portion 562 (see FIG. 57). The middle cap layer portion 562 may be planarized if desired.

Figure 58:
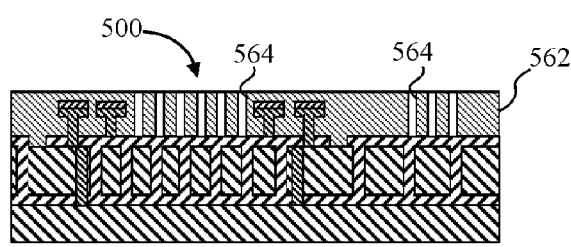
Figure 59:
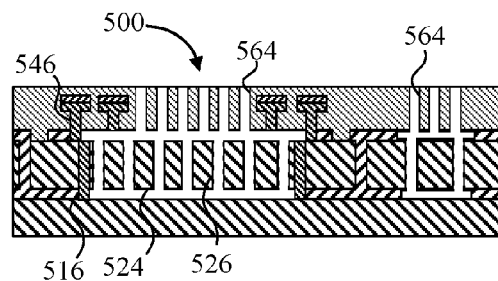

Referring to FIGS. 58 and 59, after vent holes 564 are formed, an HF vapor etch release is performed which releases the middle cap layer portion 562 from the proof mass 524. Horizontal etching of the oxide layer 530 is limited by the etch stop nitride portions 546. The sacrificial etch holes 526 allow the etch to release the proof mass 524 from the handle layer 502 by etching the buried oxide layer 504. Horizontal etching of the buried oxide layer 534 is limited by the etch stop nitride columns 516.

Figure 60:
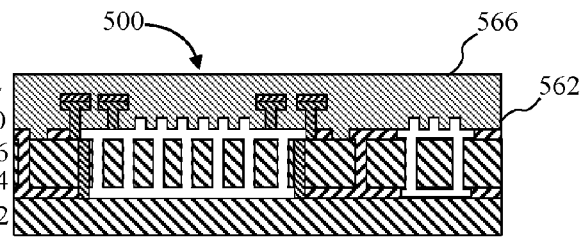

A clean high temperature seal is then performed in an epi reactor to seal the vent holes 564. The resulting configuration is shown in FIG. 60 wherein a layer portion 566 is formed above the middle cap layer portion 562.

Figure 61:
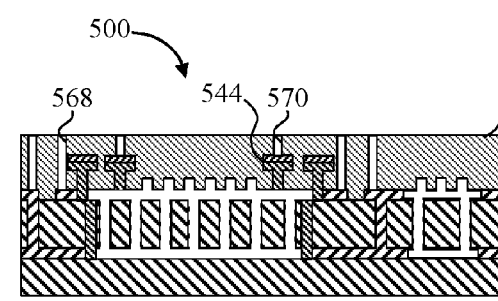
Figure 62:
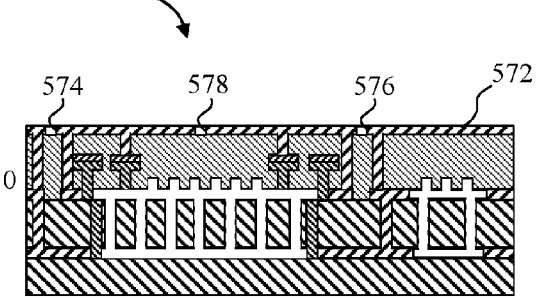

Trenches 568 and trenches 570 are then etched as depicted in FIG. 61. The trenches 570 extend from the upper surface of the layer portion 566 to the upper surface of the gasket 554, the oxide layer portion of which acts as an etch stop. The trenches 568 extend from the upper surface of the layer portion 566 to the upper surface of the oxide layer 530 which acts as an etch stop. A passivation layer 572, which may be oxide, nitride, etc., is then deposited on the upper surface of the layer portion 566 as depicted in FIG. 62. The passivation layer 572 is etched to create openings 574 and 576, and optionally 578. A metal layer may then be deposited on the passivation layer 572, and etched to create bond pads or traces, resulting in a configuration such as the configuration of the accelerometer 490 of FIG. 40.

The above described procedure and variations thereof allow for resonators, inertial sensors, and other such devices to be packaged at the wafer level while incorporating an electrically isolated, out-of-plane electrode into a thin-film cap. Other sensors which may be fabricated in accordance with principles discussed above include silicon cap pressure sensors.

The etch stop ring 227 provides the ability to use a different material than the nitride etch stops. Rather than providing a lateral etch stop using a film such as silicon nitride, relocating an etch stop ring to additional locations (desired membrane perimeter) provides an improved etch stop material with regard to the etch selectivity, continuation of material properties (silicon-silicon-silicon vs. silicon-nitride-silicon), and mechanical discontinuities. Incorporation of an etch stop ring also allows for a simpler process compared to nitride etch stops. The etch stop ring further provides excellent electrical contact between the upper and lower layers.

The etch stop ring described above allows material which was previously used as a point of electrical contact to also serve as a lateral etch stop and material continuation of the two layers. The material for the etch stop ring in some embodiments is the same material as the lower layer and first cap layer. In some embodiments, the etch stop ring is formed as epi-polysilicon (grown from single crystal or polycrystalline silicon) while in other embodiments the etch stop ring is polysilicon (LPCVD, PECVD, or other).

The above described etch stop ring can be used to provide a single perimeter etch stop. In some embodiments, a series of etch stop portions are incorporated to improve the mechanical connection between layers (concentric full or partial circles for example). If desired, one or more vacuum chambers can be formed between the etch stop rings. In different embodiments, the width of the etch stop feature (ring, partial ring, or line) ranges from 1 μm wide to several 10's of microns wide.

While the invention has been illustrated and described in detail in the drawings and foregoing description, the same should be considered as illustrative and not restrictive in character. It is understood that only the preferred embodiments have been presented and that all changes, modifications and further applications that come within the spirit of the invention are desired to be protected.

What is claimed is:

1. A device with an out-of-plane electrode comprising:
   a device layer positioned above a handle layer;
   a first electrode defined within the device layer;
   a cap layer having a first cap layer portion spaced apart from an upper surface of the device layer by a gap, and having an etch stop perimeter defining portion defining a lateral edge of the gap; and
   an out-of-plane electrode defined within the first cap layer portion by a permanent spacer.

2. The device of claim 1, wherein the spacer comprises:
   a first silicon nitride portion extending upwardly from a lower surface of the cap layer;
   a second silicon nitride portion extending downwardly from an upper surface of the cap layer; and
   an etch stop portion located between the first silicon nitride portion and the second silicon nitride portion.

3. The device of claim 2, further comprising:
   a buried oxide layer portion located between a lower surface of the device layer and an upper surface of a handle layer; and
   an etch stop extending downwardly from the upper surface of the device layer and defining a boundary of the buried oxide layer portion, the etch stop horizontally spacing the buried oxide layer portion from an etched portion.

\* \* \* \* \*